United States Patent [19]

Kirschenman et al.

[11] 3,993,108
[45] Nov. 23, 1976

[54] APPARATUS FOR FORMING WIRE-LIKE ARTICLES
[75] Inventors: Duane L. Kirschenman; Terrell M. Shoffner, both of Winston-Salem, N.C.
[73] Assignee: Western Electric Company, Inc., New York, N.Y.
[22] Filed: Dec. 3, 1975
[21] Appl. No.: 637,435

[52] U.S. Cl. .................................. 140/105; 72/389
[51] Int. Cl.² ............................................ B21F 1/00
[58] Field of Search ............ 72/380, 382, 389, 396, 72/DIG. 10; 140/105, 106; 227/87, 88, 89

[56] References Cited
UNITED STATES PATENTS

| | | | |
|---|---|---|---|
| 2,865,021 | 12/1958 | Marzili | 227/89 |
| 3,336,954 | 8/1967 | Bach et al. | 140/105 |
| 3,696,846 | 10/1972 | Rotowdo et al. | 140/105 |
| 3,812,703 | 5/1974 | Tepper | 140/105 |
| 3,903,934 | 9/1975 | Vizy | 72/382 |
| 3,945,408 | 3/1976 | Halligan | 140/105 |

Primary Examiner—Lowell A. Larson
Attorney, Agent, or Firm—J. B. Hoofnagle, Jr.

[57] ABSTRACT

A component lead forming tool, having inside and outside lead formers, is provided with resilient "O" ring assemblies which permit horizontal lateral movement of the inside formers relative to the outside formers to allow leads of different lead diameters to be accurately formed. Each of the outside formers is formed with a longitudinal slot the depth of which equals the diameter of the smallest lead to be formed and received in the slot during a forming operation. The outside formers are movable vertically adjacent to the inside formers to bend and form the component lead over the inside formers. Horizontal lateral movement of the inside formers by virtue of the resiliency of the "O" rings permits a temporary increase in the distance between cooperating outside and inside formers when the diameter of the component lead to be formed is greater than the depth of the slot in each of the outside formers. This allows the forming of component leads having diameters greater than the smallest lead diameter to be formed without the need for changing the outside formers or risking damage to the inside formers.

12 Claims, 8 Drawing Figures

APPARATUS FOR FORMING WIRE-LIKE ARTICLES

BACKGROUND OF THE INVENTION

1. Field of the Invention

This invention relates to an apparatus for forming wire-like articles, and more particularly to a forming tool which has a laterally movable inside former that allows formation of wire-like articles, such as leads of components, having different lead diameters.

2. Discussion of the Prior Art

In the forming of wire-like articles, such as component leads, where leads having different lead diameters are to be formed, it is well known to utilize a forming tool which includes a plurality of inside formers and a plurality of outside formers with the outside formers having a different depth guide slot therein to accommodate one diameter of the different diameters of leads to be formed. In utilizing this type forming tool a lead to be formed is supported on the inside former and is received in the guide slot of the outside former as the inside and outside formers are moved relative to each other thus allowing the outside former to bend the lead over the inside former.

In order to form wire-like articles having different lead diameters with one forming tool prior art facilities have utilized a forming apparatus which includes a pair of outside formers capable of accommodating the various size leads. Each of the outside formers in the prior art facilities include a longitudinal guide slot the depth of which is such that it will accommodate a range of leads having different lead diameters. However, in utilizing such a facility, often the smaller leads are underformed thus causing them to spring back to their preformed configurations after a forming operation is completed. Additionally, when the larger leads are formed in the forming tool, i.e., leads having diameters greater than the depth of the longitudinal guide slots, some portions of the leads which are being formed will not be received in the guide slots. Those portions of the leads external to the guide slots exert forces on the inside and outside formers thus causing damage to the inside or outside formers or the leads. Consequently, although the forming tool is capable of forming leads of components having different lead diameters, it does not always do an adequate job in forming the leads and often has deleterious effects on the forming tool and the leads.

Accordingly, it is desirable to provide a forming tool wherein leads of components having different lead diameters can be formed accurately in all instances without having to modify or change any portion of the forming tool.

SUMMARY OF THE INVENTION

It is therefore an object of this invention to provide a new and improved forming tool for use in forming wire-like articles.

Another object of this invention is to provide a forming tool capable of accurately forming wire-like articles having different diameters.

A forming tool in accordance with this invention includes means for supporting a wire-like article to allow the article to be formed thereon and means mounted for movement adjacent to the supporting means for bending and forming the wire-like article about a portion of the supporting means. Means are also provided for moving the bending and forming means to bend and form the wire-like article. Still further, means are provided which permit movement of the supporting means away from the bending and forming means during the forming of a lead to increase the distance between the supporting means and the bending and forming means and provide sufficient space for the lead being formed therebetween.

BRIEF DESCRIPTION OF THE DRAWING

Other objects and advantages of the present invention will be apparent from the detailed description when considered in conjunction with the accompanying drawings in which.

DETAILED DESCRIPTION

Figure 1:
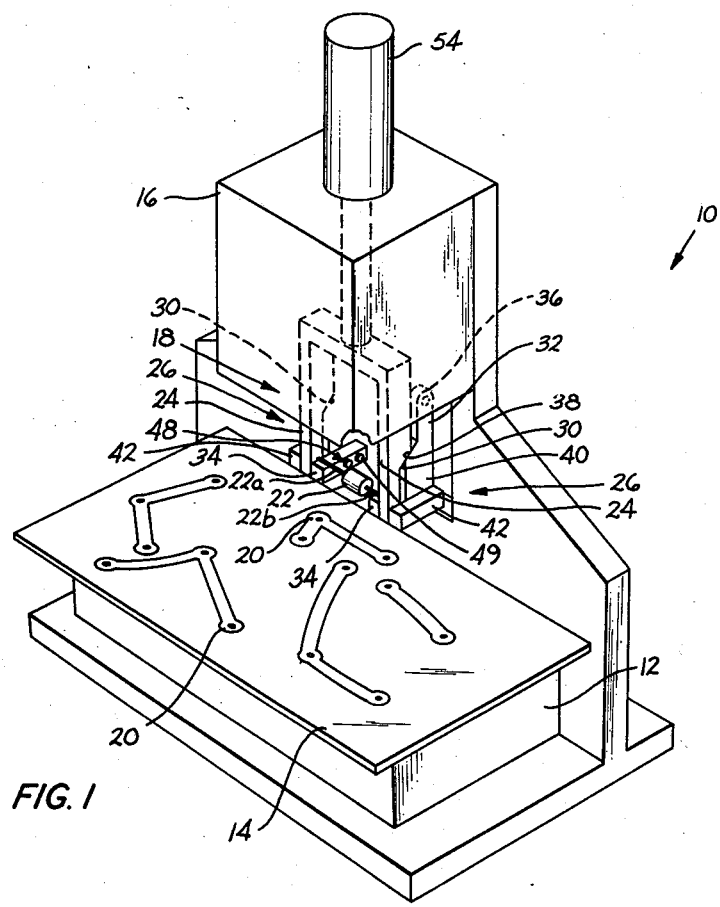
FIG. 1 is a perspective view showing a typical component insertion apparatus with a forming tool in accordance with this invention.

As illustrated in FIG. 1, a component insertion apparatus, generally designated by the numeral 10, is provided with a supporting platform 12, which supports a printed circuit board 14, an upper housing 16, and a forming tool, generally designated by the numeral 18. The circuit board 14, supported on the platform 12, is formed with apertures 20—20 which are positioned with respect to a component 22 so that wire-like articles of the component, such as leads 22a and 22b, may be inserted into the apertures.

Figure 2:
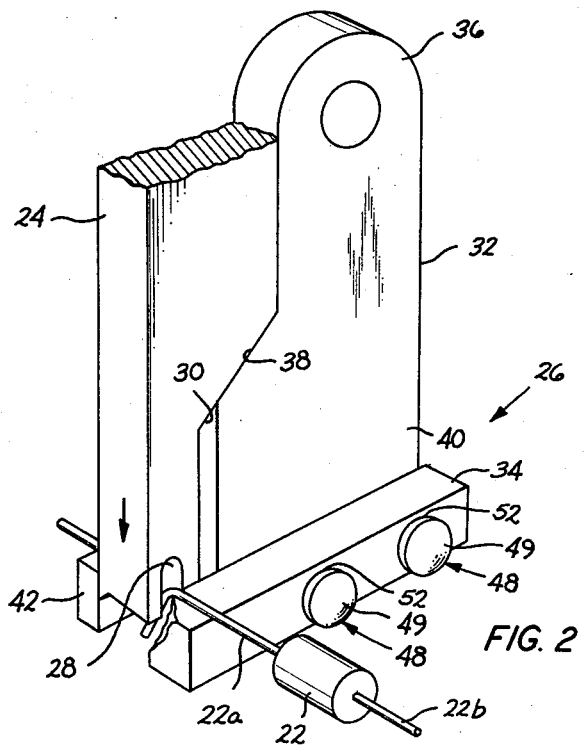
FIG. 2 is a partial perspective view showing a portion of the forming tool in accordance with certain principles of this invention.

The forming tool 18 includes a pair of spaced-apart outside formers 24—24, which may be forming fingers or any other such tool and a pair of spaced-apart inside formers 26—26. As illustrated in FIG. 2, each outside former 24 is formed with a longitudinal lead-receiving guide slot 28, which extends along a lower portion of the outside former, and a camming surface 30 located on an intermediate portion of the outside former. The depth of the guide slot 28 is equal to the diameter of the smallest component lead to be formed by the forming tool 18 and can be, for example, 0.020 inches.

Each inside former 26 includes a longitudinal support arm 32 and a lead support block 34. The support arm 32 is mounted for pivotal movement at an upper end 36 of the support arm in the upper housing 16. The support arm 32 is formed with a camming surface 38 (FIGS. 1 and 2), between the upper end 36 and a lower end 40. During a component insertion operation, the outside former 24 is lowered whereby the camming surface 38 engages the camming surface 30 to pivot the support arm 32 rearwardly. A lead severing block 42 is integrally formed with the support arm 32 at the lower end 40 of the support arm.

Figure 3:
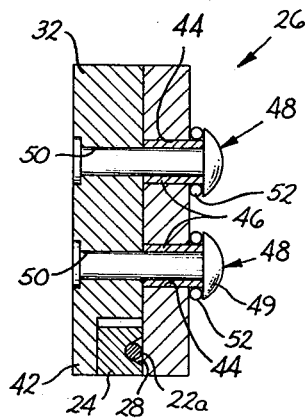
FIG. 3 is a cross-sectional top view showing a portion of the forming tool of FIG. 2 while the forming tool is forming a component lead having a small lead diameter.

The lead support block 34 is formed with a plurality of apertures 44—44 (FIGS. 3 and 4) each of which receive a bushing 46 therein. A plurality of threaded fastners 48—48 having head portions 49 extend through the bushings 46 of the support blocks 34 and into threaded apertures 50—50 in the support arm 32 thereby coupling the lead support block to the lower end 40 of the support arm 32 on a surface opposite the lead severing block 42.

A plurality of resilient "O" rings 52—52 (FIGS. 2, 3, and 4) are each positioned around each of the bushings 46—46 and captured between the head 49 of the fastners and the lead support block 34. The "O" rings 52—52 positioned in this manner enable lateral movement of the lead support block 34 away from the support arm 32 when forces are applied to the lead support block resulting from the forming of a lead having a diameter larger than the depth of the slot 28.

An air cylinder 54 (FIG. 1) which is coupled to the outside formers 24 and located in the upper housing 16 slidably urges the outside formers vertically within the upper housing during the forming and inserting operations.

Figure 5:
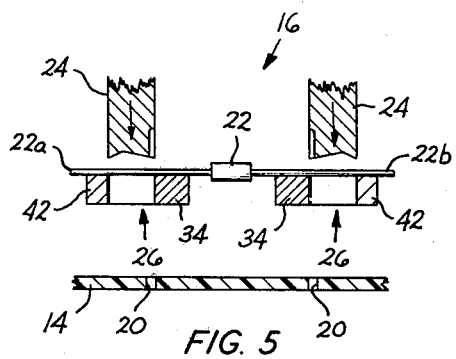
FIG. 5 is a sectional view of the forming tool prior to initiation of the forming operation.

In utilizing the forming tool 18, portions of the component leads 22a and 22b of the component 22 are each supported on the inside formers 26 of the forming tool 18 and have end portions which rest on the lead severing blocks 42 as shown in FIG. 5. An intermediate portion of each of the leads 22a and 22b straddles the space between the associated inside former 26 and lead severing block 42. Upon activation of the air cylinder 54 (FIG. 1), the outside formers 24 are moved downwardly into the spaces between the support blocks 34 and the lead severing blocks 42 to engage the intermediate portions of leads 22a and 22b causing excess end portions of the leads to be severed by the lead severing blocks.

Figure 6:
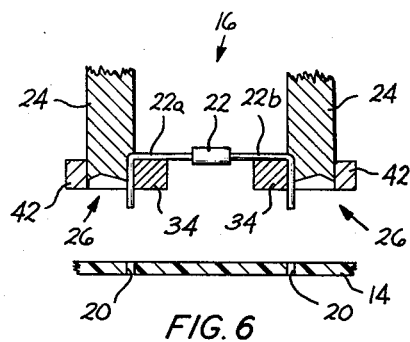
FIG. 6 is a sectional view of the forming tool during the forming operation.
Figure 7:
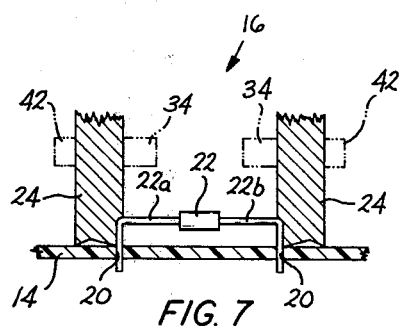
FIG. 7 is a sectional view of the forming tool during the insertion operation.

After the excess portions of leads 22a and 22b are severed, the continued downward movement of the outside formers 24 causes the leads to be received in the guide slots 28 of the outside formers so that the leads can be bent and formed over the lead support blocks 34 (FIG. 6) of the inside formers 26. Once the outside formers 24 have been driven to bend the leads 22a and 22b, the camming surfaces 30 of the outside formers engage the camming surfaces 38 of the support arms 32 to pivot the support arms and displace the inside formers 26 rearwardly. Upon rearward displacement of the inside formers 26, the outside formers 24 are then permitted to continue their downward movement to an insertion position (FIG. 7) whereat the free ends of the preformed leads 22a and 22b are inserted into the apertures 20 of the printed circuit board 14. Once the free ends of the preformed leads 22a and 22b have been inserted in the apertures 20, a pushing apparatus (not shown), forming a part of the component insertion apparatus 10, pushes the leads into the apertures a designated distance and the leads are then bent and secured on the opposite surface of the printed circuit board 14.

Figure 4:
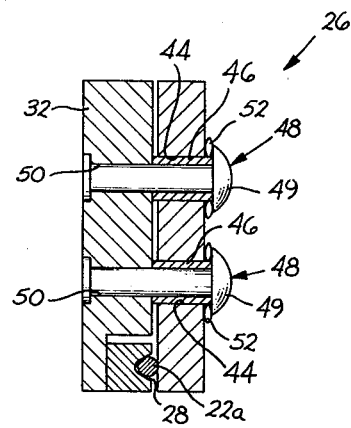
FIG. 4 is a cross-sectional top view of a portion of the forming tool of FIG. 2 while the forming tool is forming a component lead having a lead diameter greater than the depth of a lead-receiving slot in the forming tool.
Figure 8:
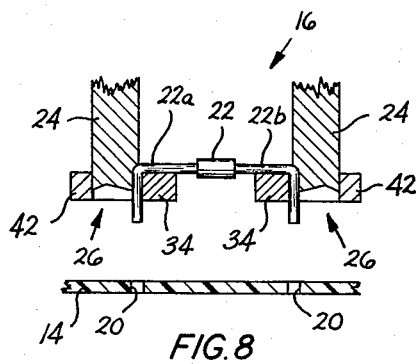
FIG. 8 is a sectional view of the forming tool while forming a component having a large lead diameter.

When leads 22a and 22b to be formed are oversized, i.e., they have diameters greater than the depth of the guide slots 28, as illustrated in FIGS. 4 and 8, some portions of the leads which are being formed will not be received in the guide slots. Those portions of the leads 22a and 22b external of the guide slots 38 exert pressure on the lead support blocks 34 as the outside formers 24 are moved downwardly adjacent to the lead support blocks. The pressure exerted on the "O" rings 52—52 by the lead support blocks 34 causes compression of the "O" rings. When the "O" rings 52—52 are compressed, the lead support blocks 34 move laterally away from the outside formers 24 to increase the distance between the outside formers and the lead support blocks. The increased distance between the lead support blocks 34 and the outside formers 24 provides additional clearance for those portions of the leads 22a and 22b which are external of and not received in the guide slots 28 thereby permitting the leads to be accurately formed although the diameters of the leads are greater than the depth of the guide slots.

With the present invention, components having lead diameters equal to or greater than the depth of the guide slot 28 in the outside former 24, for example, 0.020 inch to 0.043 inch, can be formed without having to modify the forming tool in any way.

It is to be understood that the above-described embodiment is simply illustrative of this invention. Other embodiments may be devised by those skilled in the art which will embody the principles of the invention and fall within the spirit and scope thereof.

What is claimed is:

1. Apparatus for forming a wire-like article comprising:
   means for supporting a wire-like article so that the article can be bent and formed thereover;
   means mounted for movement adjacent to and cooperating with the supporting means for bending and forming the wire-like article;
   means for moving the bending and forming means to bend and form the wire-like article; and
   means for permitting movement of the supporting means away from the bending and forming means during the forming of the wire-like article to increase distance between the supporting means and the bending and forming means to provide sufficient space therebetween for the wire-like article being formed thereby.

2. Apparatus as defined in claim 1 wherein the means for bending and forming the wire-like article includes a forming member having a slot therein for receiving portions of the wire-like article therein during forming, the slot having a depth equal to the thickness of the smallest wire-like article selected to be formed.

3. An apparatus as defined in claim 2 wherein the means for permitting movement of the supporting means includes a resilient member, the resilient member being compressed when the wire-like article to be formed has a thickness greater than the depth of the slot in the forming member so that the supporting means is permitted to resiliently move away from the forming member to provide sufficient space therebetween for the wire-like article being formed thereby.

4. An apparatus as defined in claim 3 wherein the resilient member includes at least one resilient "O" ring.

5. Apparatus as defined in claim 1 wherein the apparatus further includes:
   a lead severing block; and
   the supporting means further includes:
   a lead support block; and
   a support arm wherein the lead support block and the lead severing block are each coupled on opposite surfaces of the support arm so that portions of the wire-like article can be supported on the lead support and severing blocks to be severed and then formed upon moving the bending and forming means to bend and form the wire-like article.

6. Apparatus for forming leads of a component comprising:
a pair of spaced-apart inside formers having portions of the leads to be formed supported thereon;
a pair of spaced-apart outside formers mounted for movement adjacent to the inside formers for bending and forming the component leads about at least a portion of the inside formers;
means for moving the outside formers to bend and form the component leads; and
resilient means for permitting movement of the inside formers away from the outside formers during the forming of the leads to increase distance between the inside and outside formers to provide sufficient space therebetween for the leads being formed thereby.

7. An apparatus for forming leads of a component comprising:
a pair of spaced-apart lead support blocks for supporting leads extending from a component to allow the leads to be bent and formed at least over a portion thereof;
a pair of forming members mounted for movement adjacent to the lead support blocks for bending and forming portions of the component leads over portions of the lead support blocks, the forming members each including a longitudinal slot located therein for receiving portions of the component lead therein while the component lead is being bent and formed;
means for moving the pair of forming members to bend and form the component lead; and
resilient members which are compressable during the forming of the leads so that the lead support blocks can move away from the pair of forming members to increase distance therebetween and provide sufficient space for any portions of the leads being formed thereby which extend outwardly from the slots.

8. An apparatus as defined in claim 7 wherein the resilient members which permit movement of the lead support blocks away from the pair of forming members include a plurality of resilient "O" rings that are compressed during formation of component leads having diameters greater than the depth of the longitudinal slot in the forming members.

9. An apparatus as defined in claim 7 wherein the depth of the longitudinal slot in the forming blade is equal to the diameter of a smallest lead selected to be formed.

10. An apparatus as defined in claim 7 including a pair of spaced-apart lead severing blocks, the lead severing blocks each being associated with a corresponding one of the lead support blocks so that portions of the leads can be severed by the lead severing blocks and then formed upon movement of the pair of forming members adjacent to the lead support blocks.

11. Apparatus for forming leads of a component comprising:
a lead support block having an aperture formed therein, the lead support block for supporting a lead extending from a component to allow the lead to be bent and formed at least over a portion thereof;
a support arm having an aperture formed therein aligned adjacent to the aperture in the lead support block, the support arm mounted to support the lead support block;
means, having an enlarged end portion and other portions which extend through the aperture in the lead support block and into the aperture in the support arm, for coupling the lead support block to the support arm;
a forming member mounted for movement adjacent to the lead support block for blending and forming portions of the component lead over portions of the lead support block;
means for moving the forming member to bend and form the component lead; and
a resilient member, captured between the enlarged portion of the coupling means and the lead support block to enable movement of the lead support block away from the support arm to increase the distance therebetween and provide sufficient space for the leads being formed thereby.

12. Apparatus as defined in claim 11 wherein the forming member includes a slot therein for receiving portions of the component lead therein during forming, the slot having a depth equal to the thickness of the smallest wire-like article selected to be formed.

* * * * *